(12) United States Patent
Bernard

(10) Patent No.: US 7,298,129 B2
(45) Date of Patent: Nov. 20, 2007

(54) TIME ARBITRARY SIGNAL POWER STATISTICS MEASUREMENT DEVICE AND METHOD

(75) Inventor: Kyle L. Bernard, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/267,087

(22) Filed: Nov. 4, 2005

(65) Prior Publication Data

US 2007/0103140 A1 May 10, 2007

(51) Int. Cl.
*G01R 23/16* (2006.01)
*G06F 19/00* (2006.01)

(52) U.S. Cl. .............................. 324/76.22; 324/76.21; 702/77; 702/60

(58) Field of Classification Search ............. 324/76.24, 324/76.22, 76.21; 702/76, 77, 60
See application file for complete search history.

(56) References Cited

U.S. PATENT DOCUMENTS

| | | | | |
|---|---|---|---|---|
| 3,581,191 | A * | 5/1971 | Anderson ................... | 324/310 |
| 3,881,097 | A * | 4/1975 | Lehmann et al. ........... | 708/405 |
| 4,607,216 | A * | 8/1986 | Yamaguchi et al. ..... | 324/76.21 |
| 6,904,269 | B1 * | 6/2005 | Deshpande et al. ......... | 455/142 |
| 2002/0191710 | A1 * | 12/2002 | Jeckeln et al. .............. | 375/296 |
| 2003/0198200 | A1 * | 10/2003 | Diener et al. ............... | 370/329 |
| 2006/0015277 | A1 * | 1/2006 | Bernard et al. .............. | 702/76 |
| 2006/0155493 | A1 * | 7/2006 | Hofmeister .................. | 702/77 |
| 2006/0250936 | A1 * | 11/2006 | Chen et al. ................ | 370/208 |

FOREIGN PATENT DOCUMENTS

JP   08294199 A   * 11/1996

* cited by examiner

*Primary Examiner*—Anjan Deb
(74) *Attorney, Agent, or Firm*—Matthew D. Rabdau; Michael A. Nelson

(57) ABSTRACT

A measurement instrument is provided with an FFT module providing a frequency domain output; and a power calculator connected to the frequency domain output to measure power statistics for a test signal of arbitrary length. In some embodiments, a spectrum integration module is provided to calculate the power contained within a frequency band. In an embodiment, a filter/averaging module is provided to compute signal power statistics over an arbitrary time period. Accumulators may be provided to store data related to maximum power, minimum power, average power, or peak to average power. A CCDF module may be provided in some embodiments to calculate CCDF related measurements. Also provided are methods of making power statistic measurements.

19 Claims, 2 Drawing Sheets

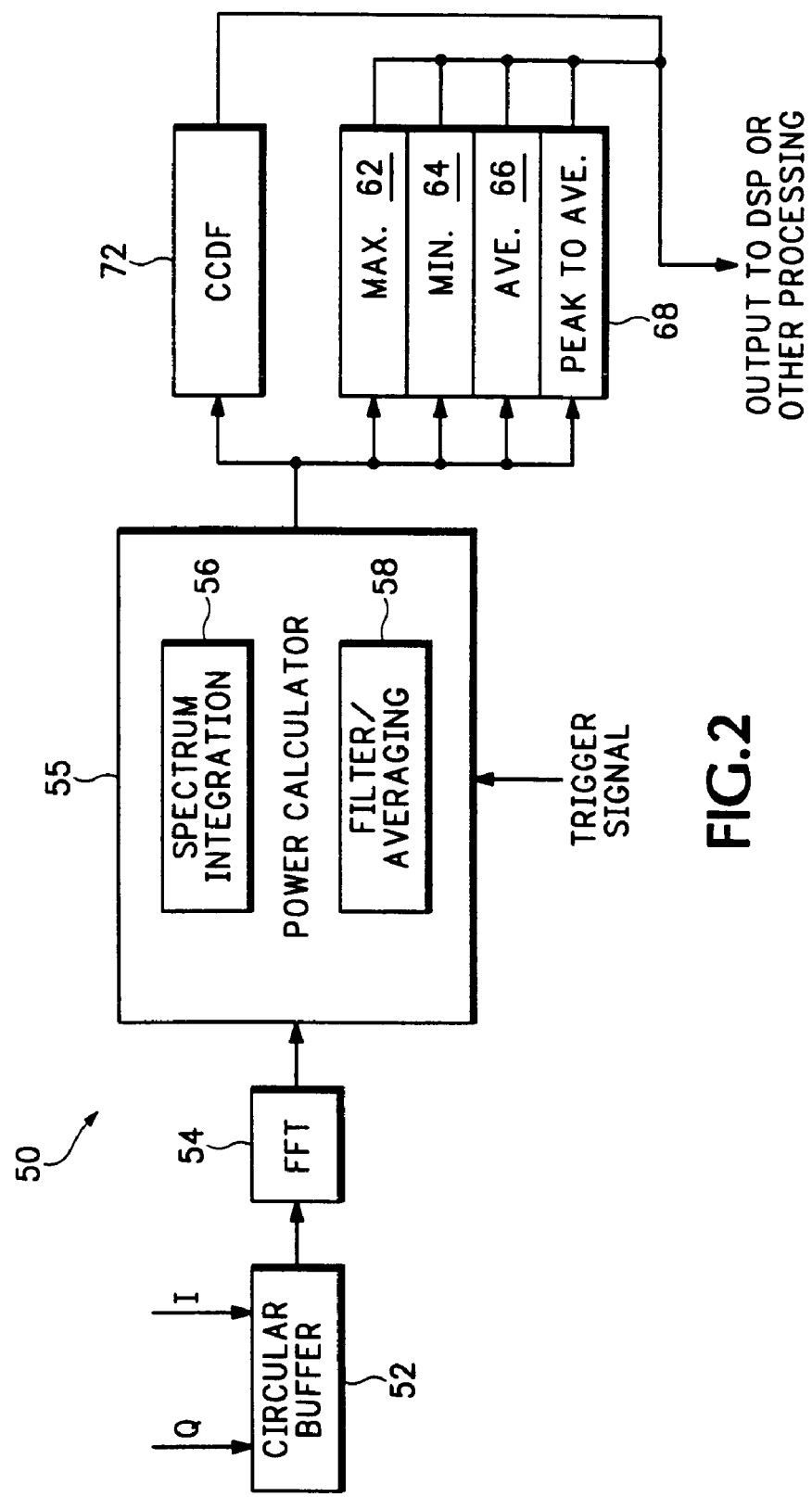

TIME ARBITRARY SIGNAL POWER STATISTICS MEASUREMENT DEVICE AND METHOD

BACKGROUND

The present invention relates generally to measurement instruments, and more specifically to real-time spectrum analyzers.

Measurement instruments, such as spectrum analyzers and oscilloscopes, have the ability to acquire and analyze data in real-time. Examples of spectrum analyzers capable of making real-time measurements include Tektronix® WCA200, WCA300, RSA2200, and RSA3300 series spectrum analyzers, which are manufactured by Tektronix, Inc. of Beaverton, Oreg. These spectrum analyzers capture and analyze seamless blocks of data.

Real-time digital measurement instruments use an acquisition memory to store signals as they are being captured in real time. Triggers, such as frequency mask triggers, allow events occurring before, during and after the trigger to be captured and displayed, or saved for further processing. In addition to providing triggers to identify aspects of signal, it would be useful to make other measurements covering an entire signal, even when the total signal exceeds the capacity of the acquisition memory.

SUMMARY

Accordingly, a measurement instrument comprising an FFT module providing a frequency domain output; and power calculator connected to the frequency domain output to measure power statistics for a test signal of arbitrary length is provided. Some embodiments may include a spectrum integration module to calculate the power contained within a frequency band, or a filtering/averaging module for calculating averages. Various embodiments of the measurement instrument include accumulators for storing power measurement data such as maximum power, average power, minimum power, and peak to average power. A CCDF module may be provided in some embodiments to track power trends.

The measurement instrument provides an ability to make power measurements on signals of arbitrary length. An embodiment of the method includes converting a signal into a frequency domain, and then calculating power statistics in the frequency domain. The calculated power statistics may include, maximum power, minimum power, average power, peak to average power, or CCDF measurements.

Aspects of the various embodiments of the present invention will become apparent from the following detailed description when read in conjunction with appended claims and attached drawings.

BRIEF DESCRIPTION OF THE DRAWINGS

FIG. 2 illustrates an embodiment of the spectrum calculation engine.

DETAILED DESCRIPTION

Figure 1:
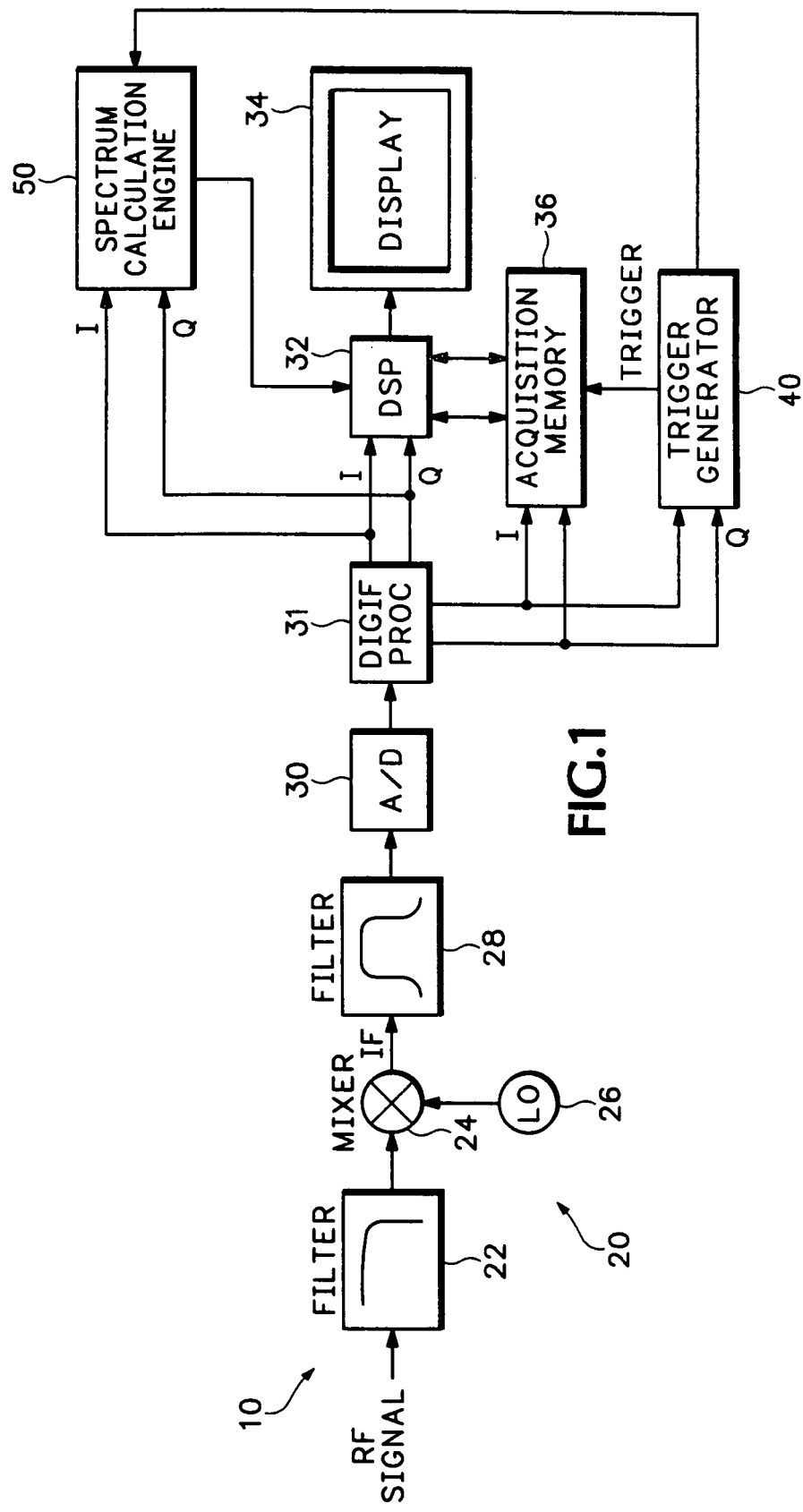
FIG. 1 illustrates a real-time spectrum analyzer with a spectrum calculation engine.

Referring now to FIG. 1, a real-time spectrum analyzer 10 is shown having an input processor 20 for receiving an input RF signal, or other signal of interest. The input processor 20 typically includes a lowpass filter 22 followed by a mixer 24 that converts the filtered input signal to an intermediate frequency (IF) signal using a local oscillator 26. The IF signal is passed through a bandpass filter 28 and then input to an analog-to-digital (A/D) converter 30 to provide a digital signal for further processing. The digital signal is input to a digital IF quadrature processor 31 to derive In-phase (I) and Quadrature-phase (Q) signals from the digital signal. The I and Q signals are input to a digital signal processor (DSP) 32 for real-time processing for display on a monitor 34, which provides a three-dimensional representation of frequency vs. time vs. amplitude, also referred to as a spectrogram. The I and Q signals are also input to an acquisition memory 36 and to a trigger generator 40. When the trigger generator 40 detects an event, a trigger is generated that causes acquisition memory 36 to hold data from before and/or after the trigger event for subsequent processing. Subsequent processing may be performed by the DSP 32, or by another processor (not shown). The subsequent processing may be used for real-time analysis or non-real-time analysis. A spectrum calculation engine 50 is connected to the digital IF quadrature processor 31 to measure signal power statistics. The signal power statistics can be measured over arbitrary duration while the instrument continues to capture and analyze signal perturbations in real time. The signal power statistics can be accumulated and updated over an arbitrary duration, even when the duration exceeds the storage capacity of the acquisition memory.

FIG. 2 provides additional detail of the spectrum calculation engine 50. An embodiment of the spectrum calculation engine 50 comprises a circular buffer 52 connected to the I and Q inputs. The output of the circular buffer is connected to a fast Fourier transform (FFT) module 54. In an alternative embodiment, no circular buffer is provided. The FFT module 54 calculates a signal spectrum based on the real time data provided by the digital IF quadrature processor 31. A power calculator module 55 is connected to the FFT module 54 to measure and calculate values related to the power contained within one or more frequency bands. These bands may be specified by the user, or provided as defaults within the instrument. In an embodiment of the spectrum calculation engine, a spectrum integration module 56 is connected to the FFT module 54, as part of the power calculator module 55. In alternative embodiments, the spectrum integration module is connected to the FFT module 54 as a separate circuit block. The spectrum integration module computes the power contained within a specific frequency band, or frequency bands, by summing and scaling the amplitude spectrum. In one embodiment, the frequency bands are provided as fixed defaults. In an alternative embodiment, the frequency bands may be selected by the user.

In an embodiment of the spectrum calculation engine 50, a filter/averaging module 58 is connected to the FFT module 54. The filter/averaging module 58 computes the signal power statistics over any arbitrary time period. The arbitrary time period may be selected by the user, or determined by trigger criteria. The filter/averaging module may be implemented as a simple block averaging function, a rolling average, or an averaging filter. As shown in FIG. 2, the filter/averaging module 58 may be implemented as a portion of the power calculator 55. In alternative embodiments, the filter/averaging module 58 may be implemented as separate circuit block.

In an embodiment of the spectrum calculation engine 50, accumulators may be provided to store certain measurement values. For example, max power accumulator 62 stores the maximum measured power within the frequency band.

Alternatively, multiple max power accumulators may be provided for multiple bands. Similarly, a minimum power accumulator 64 is provided to store information about the minimum measured power, and an average power accumulator 66 is provided to store information about the average measured power. In another embodiment, a peak to average accumulator 68 is provided. The accumulators may hold a single value in some cases, in other cases the accumulators may be implemented as a longer register that can store multiple values over time.

In some embodiments of the spectrum calculation engine, a complimentary cumulative distribution function (CCDF) module 72 is provided. The CCDF module calculates the CCDF, collects information related to the peak and stores trend information related to the maximum values. CCDF represents the probability that the peak power above average power of a measured signal exceeds a threshold. In CCDF module 72 the distribution of signal amplitudes is accumulated along with the average power. The probability of peak above average exceeding a threshold is continually calculated for probabilities ranging from 1 to 0.

As shown in FIG. 2, the circular buffer 52 and FFT module 54 are provided as components dedicated to the spectrum calculation engine 50. In alternative embodiments, for example where an FFT module is provided in connection with a real time triggering system, the output of the FFT module in the trigger generator could be connected to both the trigger circuit and the power calculator 55. This would allow existing capabilities within the trigger generator to assist in making additional useful measurements.

In some embodiments, the spectrum calculation engine 50 is implemented using an FPGA, or an ASIC. In some embodiments, the spectrum calculation engine 50 may be implemented on the same FPGA or ASIC along with portions of the trigger generator. In other embodiments, some, or all, of the modules that make up the spectrum calculation engine 50 may be accomplished using software running on a CPU, or other general purpose processor, or by a digital signal processor (DSP).

In some applications, some sample loss may be acceptable. Although sample loss is generally undesirable, these applications may still be served using a spectrum calculation engine as generally provided herein.

Measured signal power statistics provided by the spectrum calculation engine 50 may be used to make a variety of measurements. For example, comprehensive system characterization of signal behavior over a wider variety of signal conditions is possible. For Pseudo Random Bit Sequence (PRBS) driven test scenarios the continuous-time power measurements made possible by the spectrum calculation engine can be used to evaluate signal perturbation over the entire test sequence. This provides a benefit over traditional methods in cases where the duration or speed of the PRBS test sequence exceeds the signal capture capabilities of prior art instruments, or exceeds the capacity of the acquisition memory. Using the continuous-time method, measurement of power statistics over arbitrarily long time periods is supported, even while capturing and including all test signal conditions. In some embodiments, the continuous-time method measurement may also offer utility in systems that still allow blind spots during which the signal is not actually being measured, although measurement accuracy may be affected.

In embodiments of the spectrum calculation engine 50 including the CCDF module 72, the CCDF can be calculated and logged to provide trend information that may be used to evaluate nonlinearities in power amplifiers.

The spectrum calculation engine 50 also provides a method for measuring various signal power statistics such as peak-to-average ratio, peak power, average power, minimum power. For example the average power can be measured on an ongoing basis as a running average. The other measurements can also be maintained on a running basis, updating the value as a new maximum or minimum is measured.

A maximum power may be determined by measuring the current power and comparing the current power to a stored maximum power value and updating the stored maximum power value when the current power exceeds the stored maximum power value. Similarly, a minimum power may be determined by measuring the current power and comparing the current power to a stored minimum power value and updating the stored minimum power value when the current power is less than the stored minimum power value. A peak to average power measurement may be provided by comparing a current peak value to a running average power.

The spectrum calculation engine 50 also allows for a method of measuring band selective power in connection with SEM or ACLR/ACPR measurements. Measurement of the average power contained within a series of frequency bands can be used for determining SEM or ACLR/ACPR frequency zone power level. The series of frequency bands may be preset within the measurement instrument, or alternatively a user may specify frequency bands of interest. For SEM or ACLR/ACPR measurements the power level contained in each frequency zone within a series of frequency zones is calculated. In some embodiments, this calculated power level may be compared to limit specifications. The limit specifications may be preset in the instrument, or provided by a user. Using the continuous-time frequency band selective power calculation method, the power for each frequency zone is calculated in continuous time without missing signal perturbations. This method allows the power for these frequency zones to be calculated over the entire length of the test signal by letting the continuous-time power calculation run over the time length of the test signal. The test signal may be provided for example by a PRBS driven test scenario.

It will be obvious to those having skill in the art that many changes may be made to the details of the above-described embodiments of this invention without departing from the underlying principles thereof. The scope of the present invention should, therefore, be determined by the following claims.

What is claimed is:

1. A measurement instrument comprising:
   an analog-to-digital converter which receives a test signal of arbitrary length and produces a digital signal;
   an FFT module which receives the digital signal and produces a frequency domain output, the digital signal received by the FFT module not being stored in an acquisition memory; and
   a power calculator which measures power statistics of the frequency domain output for providing to a user.

2. The measurement instrument of claim 1, wherein the FFT module is provided as part of a trigger generator.

3. The measurement instrument of claim 1, further comprising a spectrum integration module to calculate the power contained within a frequency band.

4. The measurement instrument of claim 1, further comprising a filter/averaging module to compute signal power statistics over an arbitrary time period.

5. The measurement instrument of claim 4, wherein the filter/averaging module is implemented as a simple block averaging function.

6. The measurement instrument of claim 4, wherein the filter/averaging module is implemented as an averaging filter.

7. The measurement instrument of claim 1, further comprising an accumulator to store a power measurement value.

8. The measurement instrument of claim 7, wherein the power measurement value is minimum power, maximum power, average power, or peak power to average power.

9. The measurement instrument of claim 1, further comprising a complimentary cumulative distribution function (CCDF) module to calculate and store CCDF trend data.

10. A method of providing time arbitrary power statistics comprising:
   digitizing a test signal to produce a digital signal;
   converting the digital signal from a time domain to a frequency domain, the digital signal not being stored in an acquisition memory; and
   calculating power statistics within the frequency domain over an arbitrary time period in real time for providing to a user.

11. The method of claim 10, wherein converting a signal is achieved by calculating the fast Fourier transform (FFT) of the time domain signal.

12. The method of claim 10, wherein calculating power statistics comprises computing the power within a frequency band.

13. The method of claim 10, wherein calculating power statistics comprises calculating an average power.

14. The method of claim 13, wherein the average power is computed using a simple block averaging function.

15. The method of claim 13, wherein the average power is computed using an averaging filter.

16. The method of claim 10, wherein calculating power statistics comprises determining a maximum power by measuring the current power and comparing the current power to a stored maximum power value and updating the stored maximum power value when the current power exceeds the stored maximum power value.

17. The method of claim 10, wherein calculating power statistics comprises determining a minimum power by measuring the current power and comparing the current power to a stored minimum power value and updating the stored minimum power value when the current power is less than the stored minimum power value.

18. The method of claim 10, wherein calculating power statistics comprises comparing a current peak value to a running average power to provide a peak to average power.

19. The method of claim 10, further comprising calculating a complimentary cumulative distribution function.

* * * * *